(12) United States Patent
Lee et al.

(10) Patent No.: US 9,911,791 B2
(45) Date of Patent: Mar. 6, 2018

(54) DISPLAY DEVICE

(71) Applicant: Japan Display Inc., Minato-ku (JP)

(72) Inventors: Haochun Lee, Minato-ku (JP);
Michiaki Sakamoto, Minato-ku (JP);
Masaru Uchiyama, Minato-ku (JP);
Masaya Adachi, Minato-ku (JP);
Toshihiro Sato, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/335,942

(22) Filed: Oct. 27, 2016

(65) Prior Publication Data

US 2017/0179206 A1    Jun. 22, 2017

(30) Foreign Application Priority Data

Dec. 21, 2015  (JP) .................................. 2015-248893

(51) Int. Cl.
| | |
|---|---|
| *H01L 27/14* | (2006.01) |
| *H01L 29/04* | (2006.01) |
| *H01L 29/15* | (2006.01) |
| *H01L 31/036* | (2006.01) |
| *H01L 27/32* | (2006.01) |
| *H01L 51/52* | (2006.01) |

(52) U.S. Cl.
CPC ........ H01L 27/3218 (2013.01); H01L 27/322 (2013.01); H01L 27/3213 (2013.01); H01L 27/3248 (2013.01); H01L 51/5284 (2013.01)

(58) Field of Classification Search
CPC ............. H01L 27/3218; H01L 27/3213; H01L 51/5284; H01L 27/322; H01L 27/3248; H01L 27/1214; G02F 2001/136222; H01J 2329/326; G09G 2300/04; G09G 2300/0404; G09G 2300/0417; G09G 2300/0439; G09G 2300/0443
USPC .......................... 349/80, 106, 107, 108, 109
See application file for complete search history.

(56) References Cited

U.S. PATENT DOCUMENTS

| | | |
|---|---|---|
| 2006/0040132 A1 | 2/2006 | Liao et al. |
| 2008/0084376 A1* | 4/2008 | Hirota .................. G09G 3/3607 345/88 |
| 2015/0162394 A1 | 6/2015 | Tokuda et al. |

FOREIGN PATENT DOCUMENTS

| | | |
|---|---|---|
| JP | 2008-511100 | 4/2008 |
| JP | 2015-108751 | 6/2015 |

* cited by examiner

*Primary Examiner* — Julio J Maldonado
*Assistant Examiner* — Stanetta Isaac
(74) *Attorney, Agent, or Firm* — Oblon, McClelland, Maier & Neustadt, L.L.P.

(57) ABSTRACT

In a display device, light emitting areas and colored areas each have a predetermined planar shape having no rotational symmetry so that rotation of the area by an angle greater than or equal to 0° but smaller than 360° does not produce an initial shape of the area and are so arranged as to have different types of rotation angle. The colored areas are grouped based on a set of the colored areas of colors different from one another to form a plurality of full-color pixels. The full-color pixels are so arranged that the rotation angle of the colored areas of the same color have different types. In the full-color pixels of the same type, the colored areas of the same color have the same rotation angle. In the full-color pixels of different types, the colored areas of the same color have different rotation angles.

8 Claims, 13 Drawing Sheets

DISPLAY DEVICE

CROSS-REFERENCE TO RELATED APPLICATION

The present application claims priority from Japanese application JP2015-248893 filed on Dec. 21, 2015, the content of which is hereby incorporated by reference into this application.

BACKGROUND OF THE INVENTION

1. Field of the Invention

The present invention relates to a display device.

2. Description of the Related Art

In a display device using a light emitting element, such as an organic EL (electro luminescence) element, the light emitting element is controlled by using thin film transistors. Further, it is known that the light emitting element emits white light and a color filter is used to perform full-color display (JP 2008-511100 A). The color filter typically includes a black matrix.

The pixel electrodes of the light emitting element are connected via contact holes to the thin film transistors below the co holes. Since each of the contact holes is a void, no light emitting element is allowed to be formed on the contact hole. A light emitting area therefore often has a shape that avoids the corresponding contact hole, for example, a rectangular shape with part thereof cut off. In this case, when all light emitting areas, each of which has long sides and short sides, are arranged in the same orientation, the long sides, where light intensity is higher, are undesirably aligned with one another, resulting in degradation in display characteristics. JP 2015-108751 A discloses that a plurality of light emitting areas are so arranged as to be oriented differently.

A light emitting element is formed of a plurality of layers, and in a case where any of the layers is made of a metal, external light is reflected off the surface of the metal layer or the interface between the metal layer and a layer adjacent thereto. In a case where these reflection surfaces incline or have irregularities, the reflected light is visible when the screen of a display device using the light emitting element is viewed in an oblique direction. In a case where each light emitting area of the light emitting element has a shape having horizontal and vertical lengths different from each other, the intensity of the reflected light varies depending on the direction in which the reflected light is viewed. In a case where the light emitting areas are shifted from the openings of the black matrix, the portions of the black matrix that block the light emitting areas appear to be large or small depending on the viewing direction. The external light incident on the light emitting element is reflected off the contact holes, and the direction in which intense reflected light is visible varies depending on the positions of the contact holes relative to the light emitting areas.

In particular, light emitting areas oriented differently on a color basis cause the intensity of the reflected light to vary on a color basis, resulting in a problem of different luminance and tint to be viewed depending on the viewing direction.

SUMMARY OF THE INVENTION

An object of the invention is to achieve uniform luminance and tint irrespective of the viewing direction.

A display device according to the invention includes a circuit layer including a plurality of thin film transistors, a plurality of pixel electrodes provided in correspondence with a plurality of unit pixels that form an image, an insulating layer having a plurality of openings containing the plurality of pixel electrodes and so provided as to be placed on peripheral edge portions of the plurality of pixel electrodes, a light emitting element layer so layered on the insulating layer as to be in contact with the plurality of pixel electrodes in such a way that the plurality of openings form a plurality of light emitting areas, a common electrode so layered as to be in contact with the light emitting element layer above the plurality of pixel electrodes, and a color filter layer having a black matrix that forms light blocking areas and having a plurality of colored layers that form a plurality of colored areas corresponding to the plurality of light emitting areas. The plurality of light emitting areas and the plurality of colored areas each have a predetermined planar shape having no rotational symmetry so that rotation of the area by an angle greater than or equal to 0° but smaller than 360° does not produce an initial shape of the area and are so arranged as to have a plurality of different types of rotation angle. The plurality of colored areas are grouped based on a set of the colored areas of colors different from one another to forma plurality of full-color pixels. The plurality of full-color pixels are so arranged that the rotation angle of the colored areas of the same color has a plurality of different types. In the full-color pixels of the same type, the colored areas of the same color have the same rotation angle. In the full-color pixels of different types, the colored areas of the same color have different rotation angles.

According to the invention, each of the plurality of light emitting areas and the plurality of colored areas has a predetermined planar shape having no rotational symmetry, and rotation of the area by an angle greater than or equal to 0° but smaller than 360° therefore does not produce the initial shape of the area. These areas therefore appear to vary in terms of luminance and tint depending on the viewing direction. However, in the full-color pixels of different types, in which the colored areas of the same color have different rotation angles, the difference in luminance and tint is dispersed and homogenized.

Another display device according to the invention includes a circuit layer including a plurality of thin film transistors, a planarizing layer that has a plurality of contact holes for connection to the circuit layer and covers the circuit layer in such a way that an upper surface of the planarizing layer provides a flat area, a plurality of pixel electrodes provided in correspondence with a plurality of unit pixels that form an image and further so provided on the planarizing layer as to be connected to the circuit layer via the plurality of contact holes, an insulating layer having a plurality of openings containing the plurality of pixel electrodes and so provided as to be placed on peripheral edge portions of the plurality of pixel electrodes, a light emitting element layer so layered on the insulating layer as to be in contact with the plurality of pixel electrodes in such a way that the plurality of openings form a plurality of light emitting areas, a common electrode so layered as to be in contact with the light emitting element layer above the plurality of pixel electrodes, and a color filter layer having a black matrix that forms light blocking areas and having a plurality of colored layers that form a plurality of colored areas corresponding to the plurality of light emitting areas. The plurality of light emitting areas and the plurality of colored areas each have a shape having a wide width along one of two axes perpendicular to each other and a narrow width along another one of the two axes and are so arranged that the corresponding contact holes are adjacent to the light emitting areas in one direction along the narrow width and the one direction has a plurality of different types. The plurality of colored areas are grouped based on a set of the colored areas of colors different from one another to form a plurality of full-color pixels. The plurality of full-color pixels are so arranged that the one direction from the colored areas of the same color has a plurality of different types. In the full-color pixels of the same type, the one direction from the colored areas of the same color is fixed. In the full-color pixels of different types, the one direction from the colored areas of the same color varies.

According to the invention, the plurality of light emitting areas and the plurality of colored areas are so arranged that the direction from a colored area toward the corresponding contact hole has a plurality of different types. Therefore, the effect on light incident on the contact holes and reflected off the contact holes varies depending on the viewing direction. As a result, the luminance and tint of the light vary depending on the viewing direction. However, since in the full-color pixels of the different types, the direction from colored areas of the same color toward the contact holes differs between the different types, the differences in luminance and tint are dispersed and homogenized.

DETAILED DESCRIPTION OF THE INVENTION

Embodiments of the invention will be described below with reference to the drawings.

First Embodiment

Figure 1:
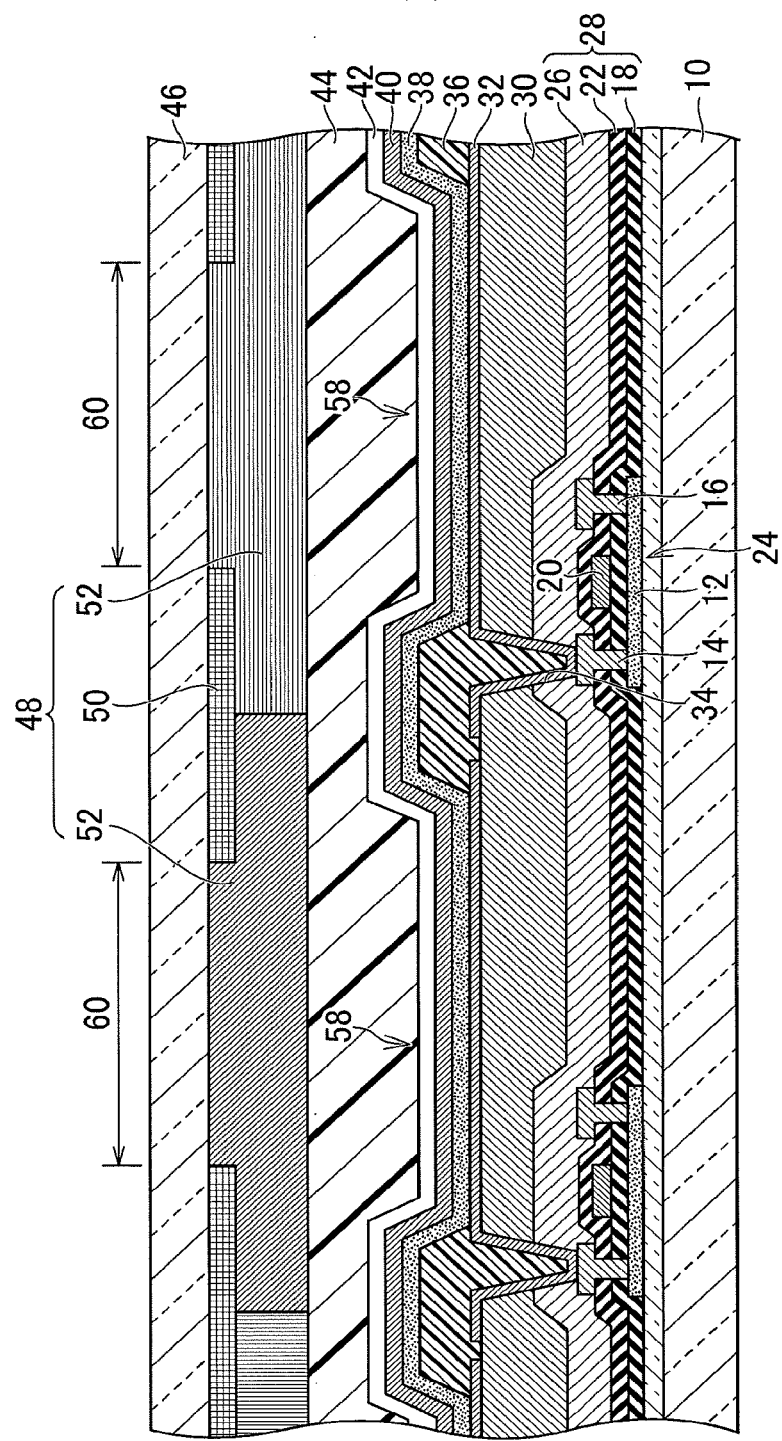
FIG. 1 is a cross-sectional view showing a display device according to a first embodiment of the invention.

FIG. 1 is a cross-sectional view showing a display device according to a first embodiment of the invention. As the display device, an organic electro-luminescence display device is presented by way of example. The display device includes a circuit substrate 10. The circuit substrate 10 has a semiconductor layer 12 formed thereon. A source electrode 14 and a drain electrode 16 are provided on the semiconductor layer 12. A gate insulating film 18 is so formed as to cover the semiconductor layer 12, and a gate electrode 20 is formed on the gate insulating film 18. An interlayer insulating film 22 is so formed as to cover the gate electrode 20. The source electrode 14 and the drain electrode 16 pass through the gate insulating film 18 and the interlayer insulating film 22. The semiconductor layer 12, the source electrode 14, the drain electrode 16, and the gate electrode 20 form a thin film transistor 24. A passivation film 26 is so provided as to cover the thin film transistors 24. The display device includes a circuit layer 28 including a plurality of thin film transistors 24.

A planarizing layer 30 is so provided on the passivation film 26 as to cover the circuit layer 28. A plurality of pixel electrodes 32 are provided on the planarizing layer 30. The planarizing layer 30 is so formed that at least the surface on which the pixel electrodes 32 are provided is a flat surface. Each of the pixel electrodes 32 is formed, for example, of a lower layer that reflects light and an upper layer that transmits light, and the pixel electrode as a whole reflects light. Each of the pixel electrodes 32 is electrically connected to one of the corresponding source electrode 14 and drain electrode 16 on the semiconductor layer 12 via a contact hole 34, which passes through the planarizing layer 30, the passivation film 26, and the interlayer insulating film 22. The contact hole 34 is connected to the circuit layer 28.

An insulating layer 36 is formed on the planarizing layer 30 and the pixel electrodes 32. The insulating layer 36 has a plurality of openings that accommodate the plurality of pixel electrodes 32. The insulating layer 36 is so provided as to be placed on peripheral edge portions of the plurality of pixel electrodes 32. The insulating layer 36 forms a bank that surrounds part of each of the pixel electrodes 32.

A light emitting element layer 38 is so provided as to be in contact with the upper side of the pixel electrodes 32. The light emitting element layer 38 is continuously placed on the plurality of pixel electrodes 32 and also placed on the insulating layer 36. As a variation, (separate) light emitting element layers 38 may be individually provided on the pixel electrodes 32. The light emitting element layer 38 includes at least a light emitting layer and may further include at least one of an electron transport layer, a hole transport layer, an electron injection layer, and a hole injection layer.

A common electrode 40 (cathode, for example) is so provided on the light emitting element layer 38 as to be in contact with the light emitting element layer 38 above the plurality of pixel electrodes 32. The common electrode 40 is so formed as to be placed above the insulating layer 36, which forms the bank. The light emitting element layer 38 is sandwiched between the pixel electrodes 32 and the common electrode 40 and emits light having luminance controlled by current flowing between the pixel electrodes 32 and the common electrode 40. The light emitting element layer 38 continuously overlies the plurality of pixel electrodes 32 and emits light of a single color (white, for example).

The light emitting element layer 38 is sealed by a sealing layer 42, which is so layered on the common electrode 40 as to seal the light emitting element layer 38, and the light emitting element layer 38 is therefore sealed against moisture. A counter substrate 46 is provided above the sealing layer 42 via a filler layer 44. The counter substrate 46 is provided with a color filter layer 48. The color filter layer 48 has a black matrix 50, which forms light blocking areas. The color filter layer 48 has a plurality of colored layers 52. The counter substrate 46 may be a touch panel or may include a polarizer or a retardation film.

Figure 2:
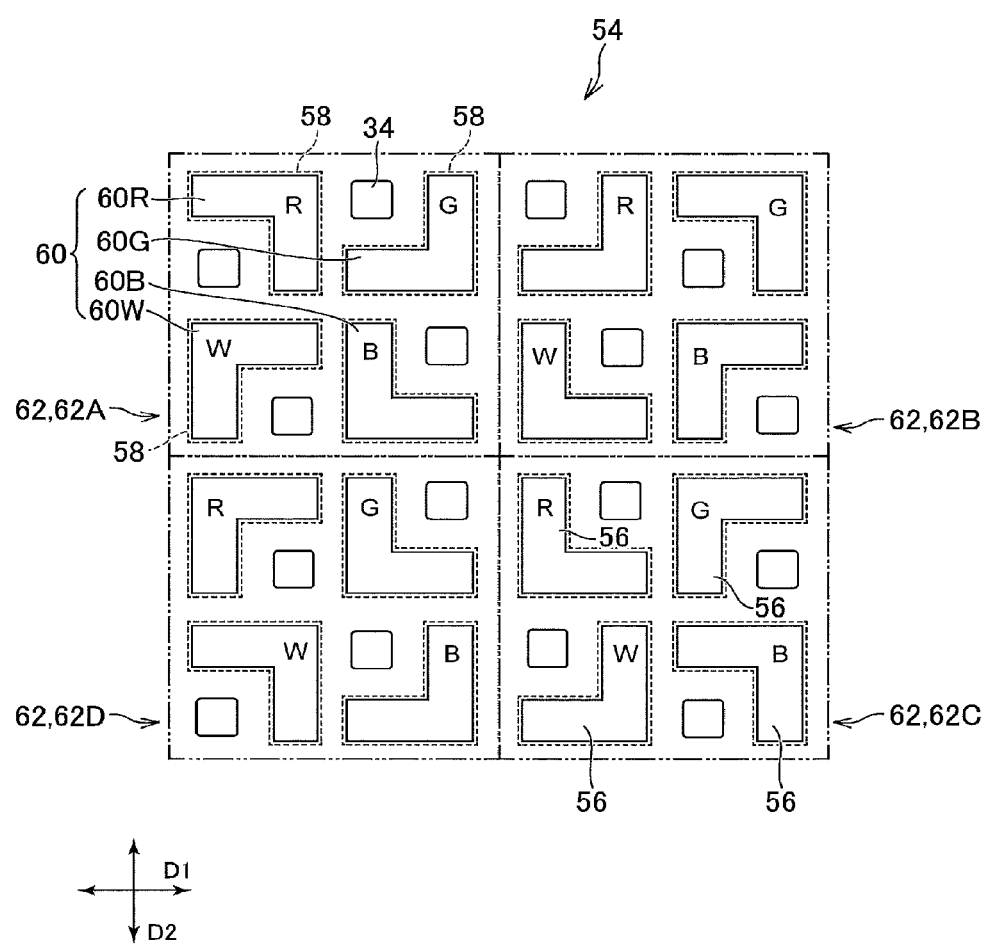
FIG. 2 is an enlarged view of part of a plane of the display device shown in FIG. 1.

FIG. 2 is a plan view of a display area 54 including part of the display device shown in FIG. 1. The display area 54 is formed of a plurality of unit pixels 56 and displays an image formed by light emitted from the unit pixels 56. The plurality of pixel electrodes 32 are provided in correspondence with the plurality of unit pixels 56, which form an image.

The plurality of openings of the insulating layer 36 form a plurality of light emitting areas 58. Light emitted through the plurality of light emitting areas 58 has the same color (white, for example). Each of the light emitting areas 58 has a planar shape having no rotational symmetry, and rotation of the light emitting area 58 by less than one turn (greater than or equal to 0° but smaller than 360°) therefore does not produce the initial shape of the light emitting area 58. The planar shape is an L-letter shape. The plurality of light emitting areas 58 are arranged by using a plurality of different types (four patterns) of rotation angle (rotation position).

Each of the plurality of colored layers 52 has a plurality of colored areas 60, which correspond to the plurality of light emitting areas 58. The colored areas 60 correspond to openings of the black matrix 50. Each of the colored areas 60 has a planar shape having no rotational symmetry, and rotation of the colored area 60 by less than one turn (greater than or equal to 0° but smaller than 360°) therefore does not produce the initial shape of the colored area 60. The planar shape is an L-letter shape. The plurality of colored areas 60 are arranged by using a plurality of different types (four patterns) of rotation angle (rotation position). The plurality of colored areas 60 are grouped on the basis of a set of colored areas 60 of a plurality of colors (four colors in the example shown in FIG. 2) different from one another to form a plurality of full-color pixels 62. In FIG. 2, a red colored area 60R, a green colored area 60G, a blue colored area 60B, and a white colored area 60W form one full-color pixel 62. The colored areas 60, which form each of the full-color pixels 62, are arranged by using a plurality of different types (four patterns) of rotation angle (rotation position). Each of the colored areas 60 has a thick-line L-letter shape that has a pair of long sides that form the corner of the L letter and a pair of short sides that are located at opposite ends of the L letter and serve as the width of the line. Colored areas 60 adjacent to each other are so rotated that any of the long sides of one of the colored areas is not adjacent to any of the long sides of the other colored area and any of the short sides of one of the colored areas is not adjacent to any of the short sides of the other colored area.

FIG. 2 shows a first full-color pixel 62A, a second full-color pixel 62B, a third full-color pixel 62C, and a fourth full-color pixel 62D, each of which has four colored areas 60 formed of two colored areas 60 adjacent to each other in a first direction D1 and two colored areas 60 adjacent to each other in a second direction D2 perpendicular to the first direction D1. In other words, the four colored areas 60 are arranged clockwise. Similarly, the first full-color pixel 62A, the second full-color pixel 62B, the third full-color pixel 62C, and the fourth full-color pixel 62D are also arranged clockwise.

The set of colored areas 60, which forms each of the plurality of full-color pixels 62, are arranged by using a plurality of different types of rotation angle (rotation position) (all different from one another, for example). In the first full-color pixel 62A located in the upper left portion of FIG. 2, a clockwise adjacent colored area 60 has a clockwise-rotation angle (clockwise-rotation position). For example, the white colored area 60W, which is adjacent clockwise to the blue colored area 60B, which has the rotation angle (rotation position) corresponding to the posture of has a 90°-clockwise-rotation angle (90°-clockwise-rotation position) with respect to the blue colored area 60B.

In the second full-color pixel 62B, which is adjacent clockwise to the first full-color pixel 62A, a clockwise adjacent colored area 60 has a counterclockwise-rotation angle (counterclockwise-rotation position). For example, the red colored area 60R, which is adjacent clockwise to the white colored area 60W, which has the rotation angle (rotation position) corresponding to the posture of "L", has a 90°-counterclockwise-rotation angle (90°-counterclockwise-rotation position) with respect to the white colored area 60W.

In the third full-color pixel 62C, which is adjacent clockwise to the second full-color pixel 62B, a clockwise adjacent colored area 60 has a clockwise-rotation angle (clockwise-rotation position). For example, the green colored area 60G, which is adjacent clockwise to the red colored area 60R, which has the rotation angle (rotation position) corresponding to the posture of "L", has a 90°-clockwise-rotation angle (90°-clockwise-rotation position) with respect to the red colored area 60R.

In the fourth full-color pixel 62D, which is adjacent clockwise to the third full-color pixel 62C, a clockwise adjacent colored area 60 has a counterclockwise-rotation angle (counterclockwise-rotation position). For example, the blue colored area 60B, which is adjacent clockwise to the green colored area 60G, which has the rotation angle (rotation position) corresponding to the posture of "L", has a 90°-counterclockwise-rotation angle (90°-counterclockwise-rotation position) with respect to the green colored area 60G.

In the present embodiment, in a set of colored areas 60 that form any of the full-color pixels 62, the colored area 60 of a certain color is located in the same position with respect to the colored areas 60 of the other colors. For example, in each of the full-color pixels 62, the red colored area 60R is located in the upper left position.

In the plurality of full-color pixels 62, the colored areas 60 of the same color are arranged by using a plurality of different types of rotation angle (rotation position). For example, the blue colored area 60B has the rotation angle (rotation position) corresponding to the posture of "L" in the first full-color pixel 62A, has a 90°-clockwise-rotation angle (90°-clockwise-rotation position) in the second full-color pixel 62B, has an another-90°-clockwise-rotation angle (another-90°-clockwise-rotation position) in the third full-color pixel 62C, and has a-still-another-90°-clockwise-rotation angle (a-still-another-90°-clockwise-rotation position) in the forth full-color pixel 62D. The number of types of rotation angle (rotation position) (4 in this example) at which the colored areas 60 of the same color are disposed is equal to the number of plurality of colors (4 in this example). In the full-color pixels 62 of the same type (first full-color pixels 62A, for example), the colored areas 60 of the same color has the same rotation angle (rotation position). In full-color pixels 62 of different types (first full-color pixel 62A and second full-color pixel 62B, for example), the colored areas 60 of the same color have different rotation angles (different rotation positions).

Figure 3:
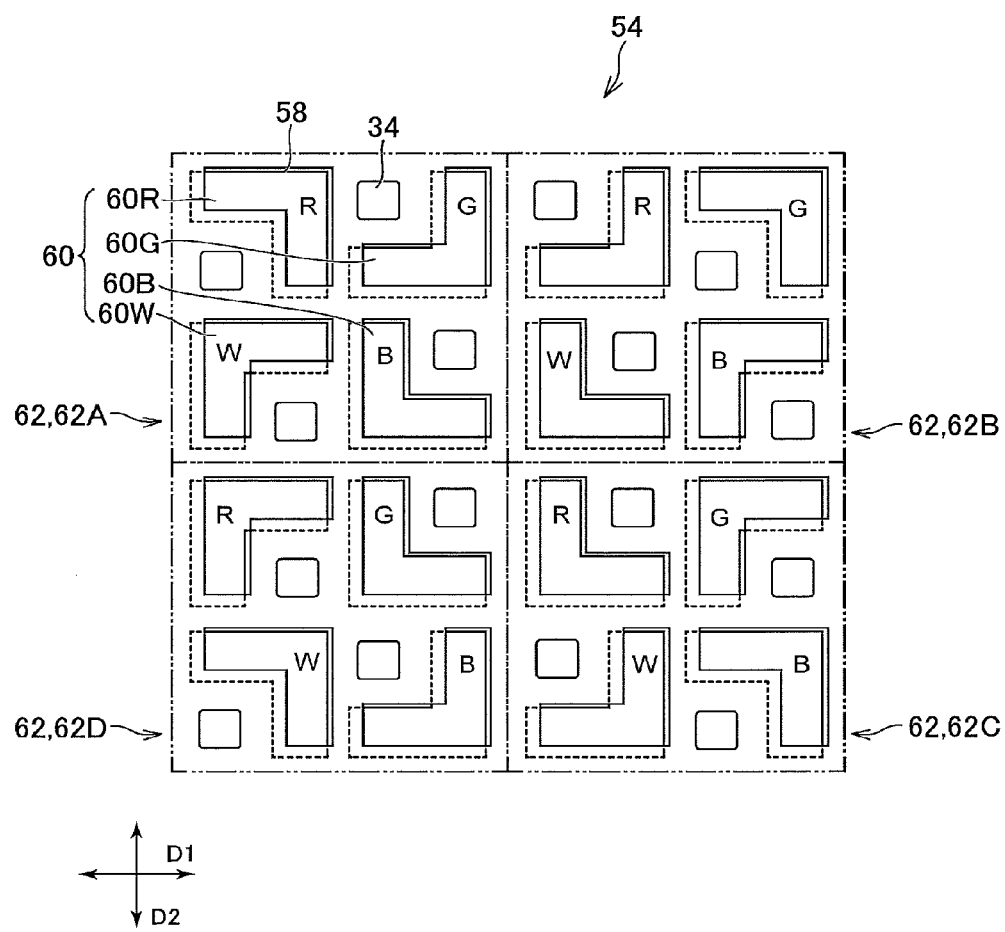
FIG. 3 describes an advantageous effect achieved by the present embodiment.

FIG. 3 describes an advantageous effect achieved by the present embodiment. FIG. 3 shows a state in which the colored areas 60 and the light emitting areas 58 are shifted from each other due to the shift of the position of the color filter layer 48. According to the present embodiment, each of the plurality of light emitting areas 58 and the plurality of colored areas 60 has a predetermined planar shape having no rotational symmetry, and rotation of the area by less than one turn (greater than or equal to 0° but smaller than 360°) therefore does not produce the initial shape of the area. These areas therefore appear to vary in terms of luminance and tint depending on the viewing direction. However, in full-color pixels 62 of different types, in which the colored areas 60 of the same color have different rotation angles (rotation positions), the difference in luminance and tint is dispersed and homogenized.

Second Embodiment

Figure 4:
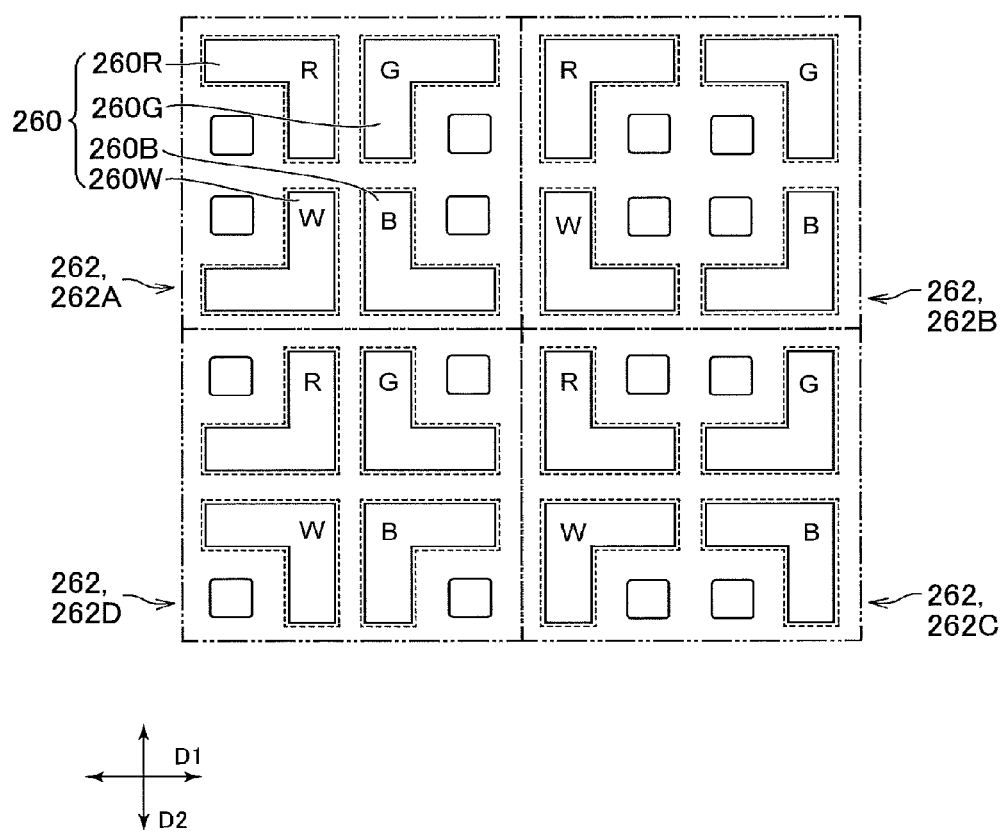
FIG. 4 is an enlarged view showing part of a plane of a display device according to a second embodiment.

FIG. 4 is an enlarged view showing part of a plane of a display device according to a second embodiment. The present embodiment differs from the first embodiment in terms of the rotation angle (rotation position) of colored areas 260, which form each full-color pixel 262.

In a first full-color pixel 262A, the colored areas 260 adjacent to each other in the first direction D1 have long sides adjacent to each other, and the colored areas 260 adjacent to each other in the second direction D2 perpendicular to the first direction D1 have short sides adjacent to each other. For example, a red colored area 260R and a green colored area 260G have long sides adjacent to each other, and a white colored area 260W and a blue colored area 260B have long sides adjacent to each other. The red colored area 260R and the white colored area 260W have short sides adjacent to each other, and the green colored area 260G and the blue colored area 260B have short sides adjacent to each other.

In a second full-color pixel 262B, all the colored areas 260 are so arranged that the short sides thereof are adjacent to each other.

In a third full-color pixel 262C, the colored areas 260 adjacent to each other in the first direction D1 have short sides adjacent to each other, and the colored areas 260 adjacent to each other in the second direction D2 perpendicular to the first direction D1 have long sides adjacent to each other. For example, the red colored area 260R and the green colored area 260G have short sides adjacent to each other, and the white colored area 260W and the blue colored area 260B have short sides adjacent to each other. The red colored area 260R and the white colored area 260W have long sides adjacent to each other, and the green colored area 260G and the blue colored area 260B have long sides adjacent to each other.

In a fourth full-color pixel 262D, all the colored areas 260 are so arranged that the long sides thereof are adjacent to each other.

Third Embodiment

Figure 5:
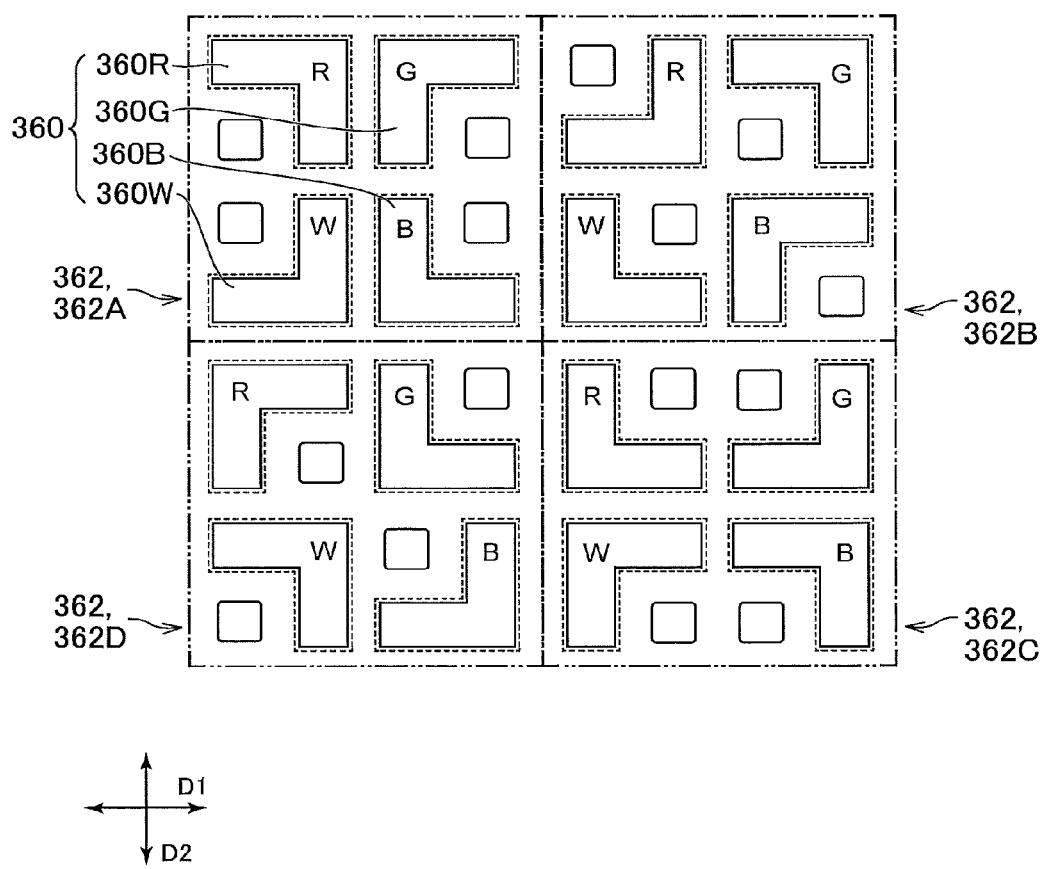
FIG. 5 is an enlarged view showing part of a plane of a display device according to a third embodiment.

FIG. 5 is an enlarged view showing part of a plane of a display device according to a third embodiment. The present embodiment differs from the first embodiment in terms of the rotation angle (rotation position) of colored areas 360, which form each full-color pixel 362.

In a first full-color pixel 362A, the colored areas 360 adjacent to each other in the first direction D1 have long sides adjacent to each other, and the colored areas 360 adjacent to each other in the second direction D2 perpendicular to the first direction D1 have short sides adjacent to each other. For example, a red colored area 360R and a green colored area 360G have long sides adjacent to each other, and a white colored area 360W and a blue colored area 360B have long sides adjacent to each other. The red colored area 360R and the white colored area 360W have short sides adjacent to each other, and the green colored area 360G and the blue colored area 360B have short sides adjacent to each other. The first full-color pixel 362A has the same configuration as that of the first full-color pixel 262A in the second embodiment.

In a second full-color pixel 362B, the colored areas 360 adjacent to each other in the first direction D1 have a long side and a short side adjacent to each other, and the colored areas 360 adjacent to each other in the second direction D2 perpendicular to the first direction D1 also have a long side and a short side adjacent to each other. For example, the red colored area 360R and the green colored area 360G have a long side and a short side adjacent to each other, and the white colored area 360W and the blue colored area 360B have a short side and a long side adjacent to each other. The red colored area 360R and the white colored area 360W have a long side and a short side adjacent to each other, and the green colored area 360G and the blue colored area 360B have a short side and alongside adjacent to each other. The second full-color pixel 362B has the same configuration as that of the second full-color pixel 62B in the first embodiment.

In a third full-color pixel 362C, the colored areas 360 adjacent to each other in the first direction D1 have short sides adjacent to each other, and the colored areas 360 adjacent to each other in the second direction D2 perpendicular to the first direction D1 have long sides adjacent to each other. For example, the red colored area 360R and the green colored area 360G have short sides adjacent to each other, and the white colored area 360W and the blue colored area 360B have short sides adjacent to each other. The red colored area 360R and the white colored area 360W have long sides adjacent to each other, and the green colored area 360G and the blue colored area 360B have long sides adjacent to each other. The third full-color pixel 362C has the same configuration as that of the third full-color pixel 262C in the second embodiment.

In a fourth full-color pixel 362D, the colored areas 360 adjacent to each other in the first direction D1 have a long side and a short side adjacent to each other, and the colored areas 360 adjacent to each other in the second direction D2 perpendicular to the first direction D1 also have a long side and a short side adjacent to each other. For example, the red colored area 360R and the green colored area 360G have a short side and a long side adjacent to each other, and the white colored area 360W and the blue colored area 360B have a long side and a short side adjacent to each other. The red colored area 360R and the white colored area 360W have a short side and alongside adjacent to each other, and the green colored area 360G and the blue colored area 360B have a long side and a short side adjacent to each other. The fourth full-color pixel 362D has the same configuration as that of the fourth full-color pixel 62D in the first embodiment.

Fourth Embodiment

Figure 6:
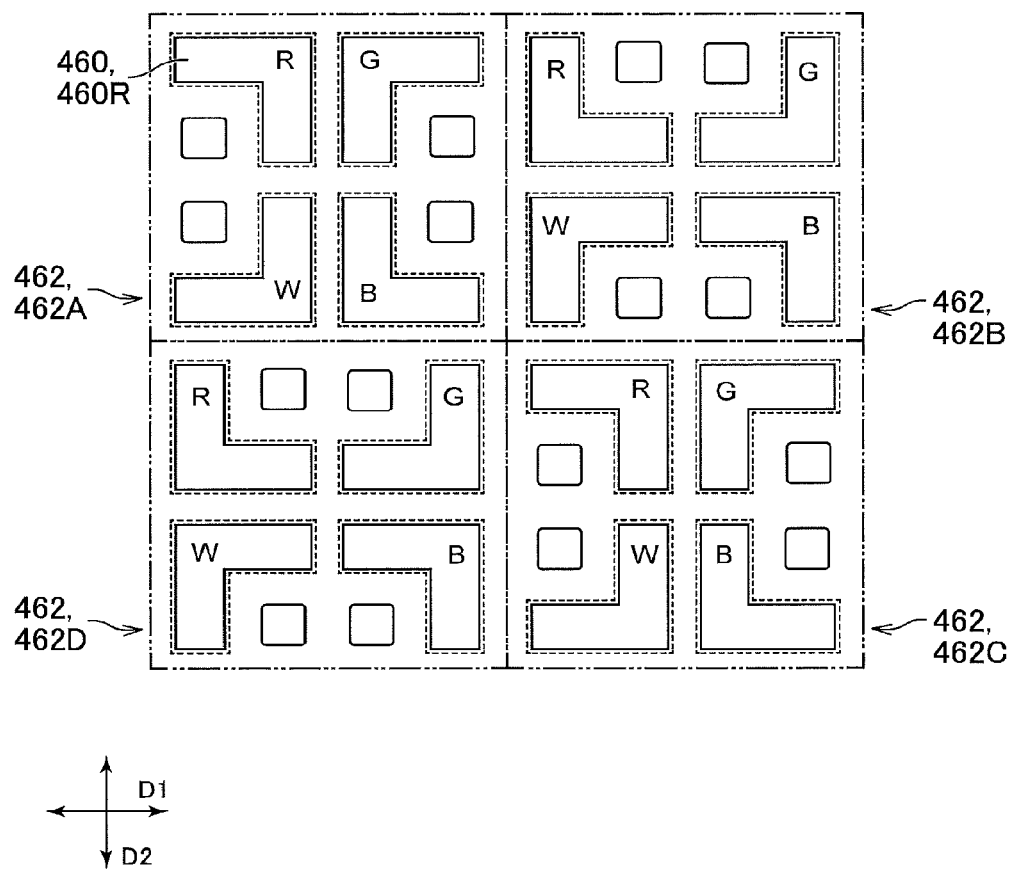
FIG. 6 is an enlarged view showing part of a plane of a display device according to a fourth embodiment.

FIG. 6 is an enlarged view showing part of a plane of a display device according to a fourth embodiment. The present embodiment differs from the first embodiment in that the number of types of rotation angle (rotation position) at which colored areas 460 of the same color are disposed is the quotient of the number of plurality of colors (4 in this example) divided by a natural number greater than or equal to 2 (2 in this example).

For example, in a first full-color pixel 462A and a third full-color pixel 462C, red colored areas 460R have the same rotation angle (rotation position). In a second full-color pixel 462B and a fourth full-color pixel 462D, the red colored areas 460R have the same rotation angle (rotation position). That is, the red colored areas 460R have two types of rotation angles (rotation positions) shifted from each other by 180° clockwise.

In each of the full-color pixels 462, the colored areas 460 adjacent to each other in the first direction D1 have short sides or long sides adjacent to each other. The colored areas 460 adjacent to each other in the second direction D2 perpendicular to the first direction D1 have long sides or short sides adjacent to each other. The other configurations correspond to the contents described in any of the above embodiments.

Fifth Embodiment

Figure 7:
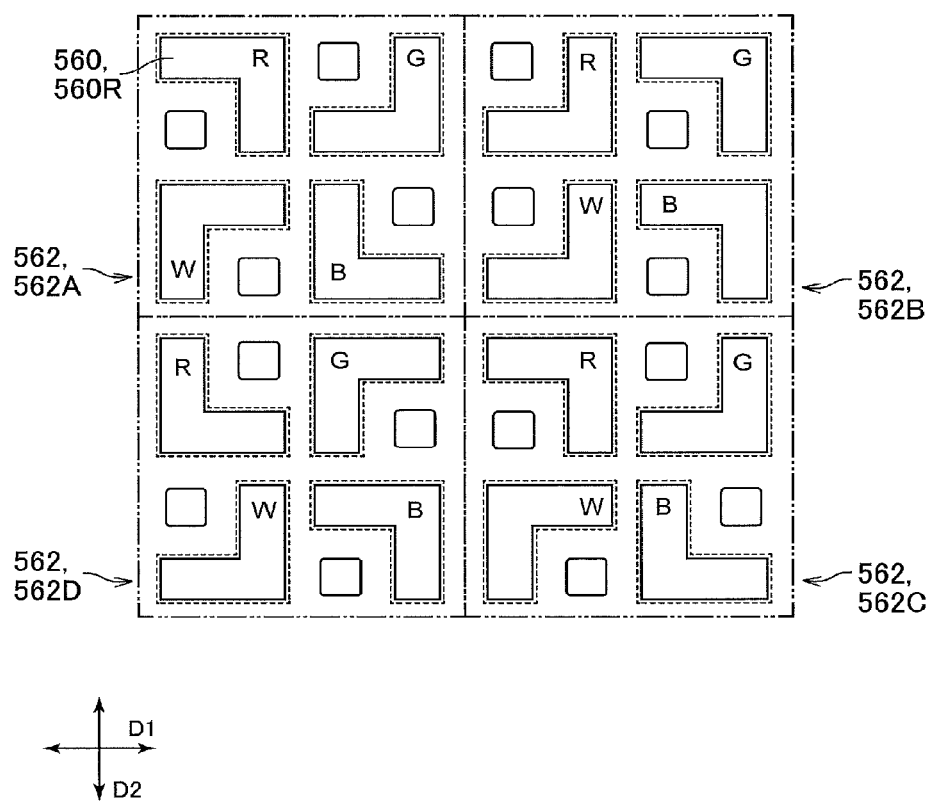
FIG. 7 is an enlarged view showing part of a plane of a display device according to a fifth embodiment.

FIG. 7 is an enlarged view showing part of a plane of a display device according to a fifth embodiment. The present embodiment differs from the first embodiment in that the number of types of rotation angle (rotation position) at which colored areas 560 of the same color are disposed is the quotient of the number of plurality of colors (4 in this example) divided by a natural number greater than or equal to 2 (2 in this example).

For example, in a first full-color pixel 562A and a third full-color pixel 562C, red colored areas 560R have the same rotation angle (rotation position). In a second full-color pixel 562B and a fourth full-color pixel 562D, the red colored areas 560R have the same rotation angle (rotation position). That is, the red colored areas 560R have two types of rotation angles (rotation position) shifted from each other by 90° clockwise.

In each of the full-color pixels 562, the colored areas 560 adjacent to each other in the first direction D1 and the second direction D2 have a short side and a long side adjacent to each other. The other configurations correspond to the contents described in any of the above embodiments.

Sixth Embodiment

Figure 8:
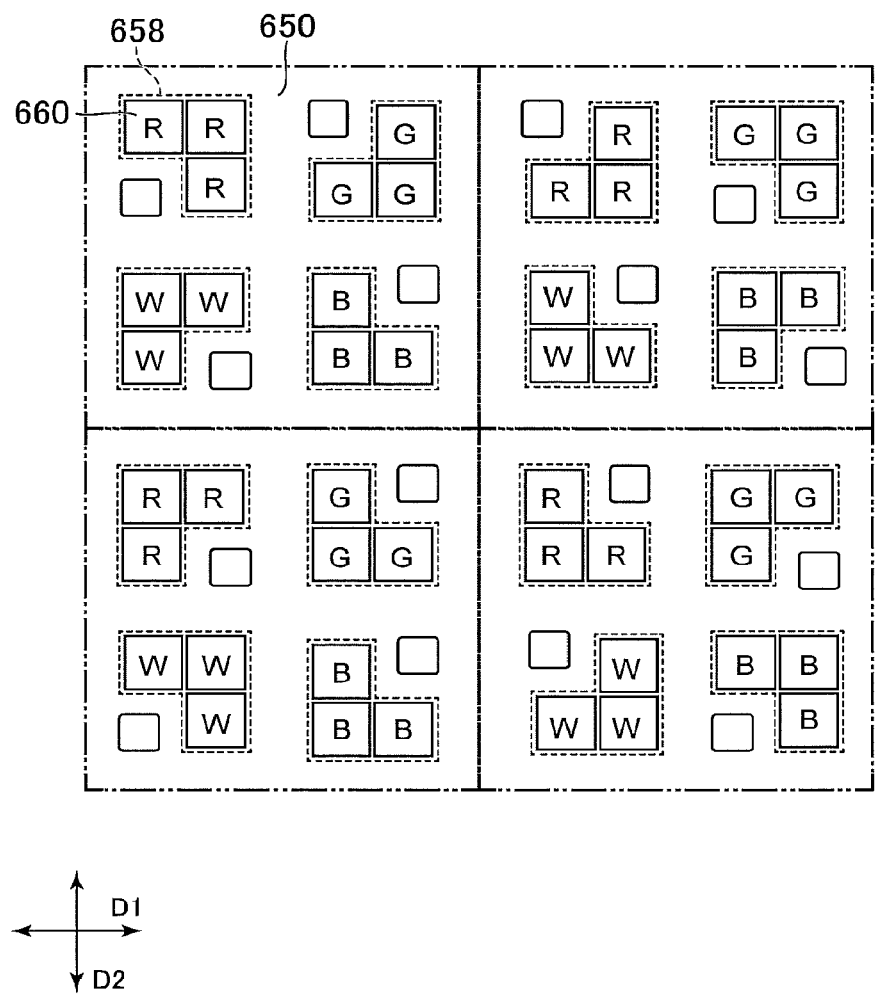
FIG. 8 is an enlarged view showing part of a plane of a display device according to a six embodiment.

FIG. 8 is an enlarged view showing part of a plane of a display device according to a sixth embodiment. In the present embodiment, each of colored areas 660 is divided into a plurality of portions by a light blocking area of a black matrix 650. A light emitting area 658 is the same as any of the light emitting areas 58 shown in FIG. 2. The other configurations correspond to the contents described in the first embodiment.

Seventh Embodiment

Figure 9:
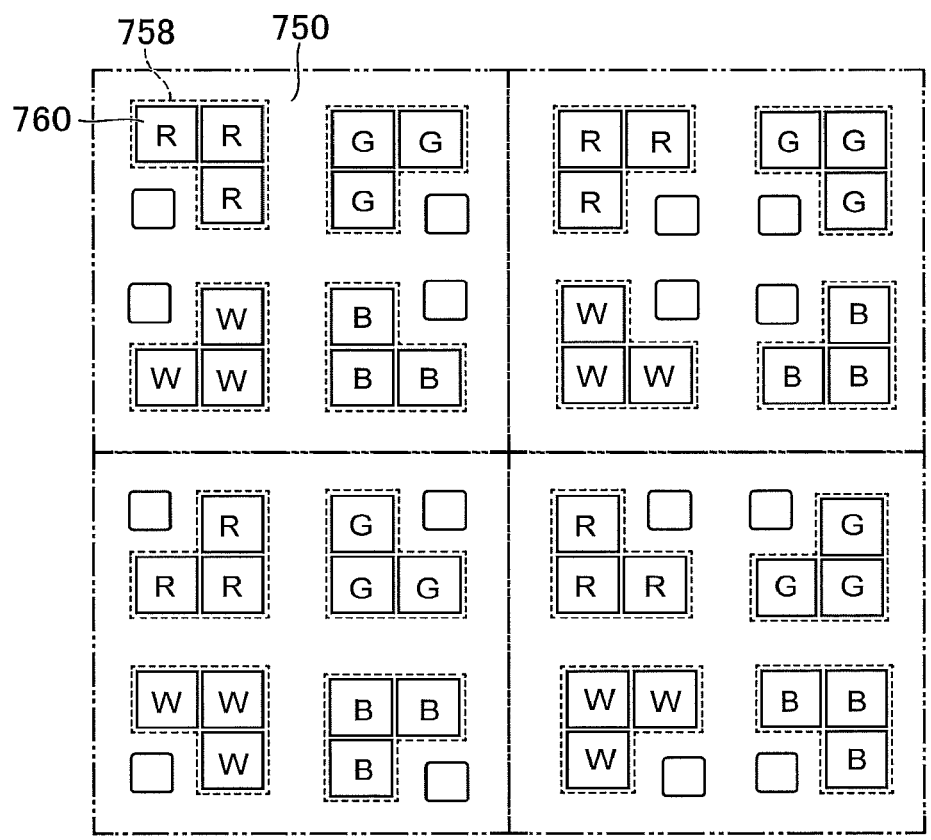
FIG. 9 is an enlarged view showing part of a plane of a display device according to a seventh embodiment.

FIG. 9 is an enlarged view showing part of a plane of a display device according to a seventh embodiment. In the present embodiment, each of colored areas 760 is divided into a plurality of portions by a light blocking area of a black matrix 750. A light emitting area 758 is the same as the light emitting area 658 shown in FIG. 8. The other configurations correspond to the contents described in the first embodiment.

Eighth Embodiment

Figure 10:
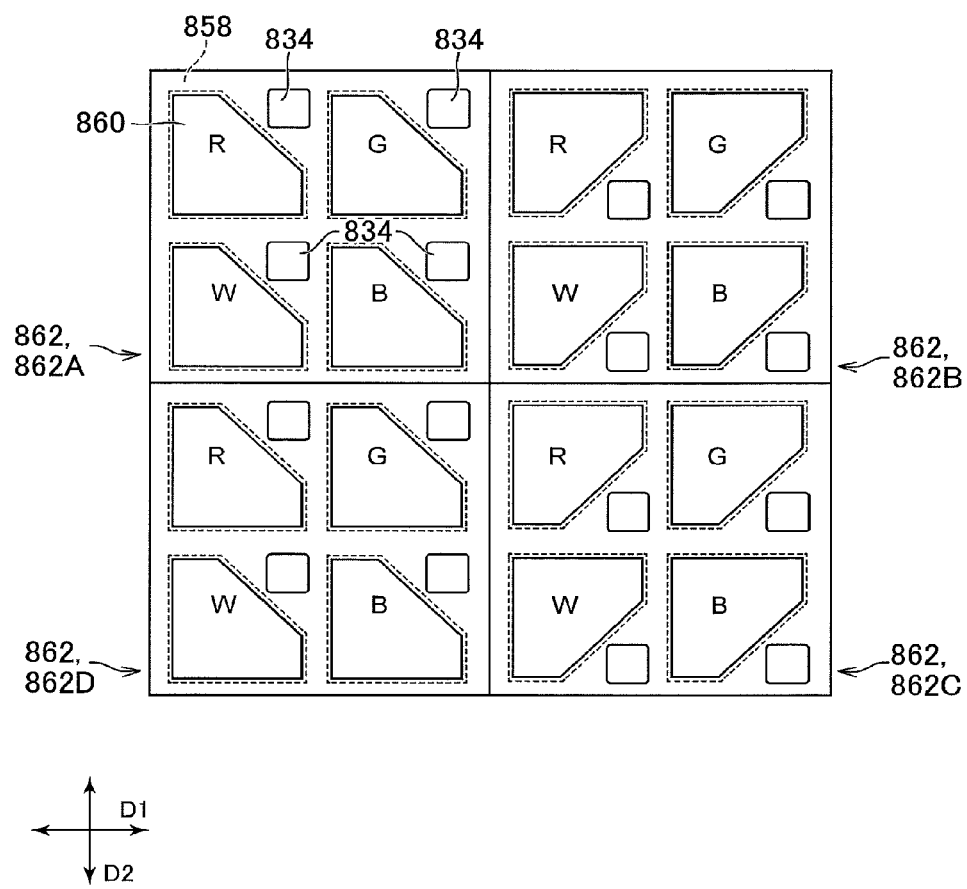
FIG. 10 is an enlarged view showing part of a plane of a display device according to an eighth embodiment.

FIG. 10 is an enlarged view showing part of a plane of a display device according to an eighth embodiment. In the present embodiment, a plurality of light emitting areas 858 and a plurality of colored areas 860 each have a planar shape formed of a rectangle with one of the corner portions thereof cut with a straight line (pentagonal shape). A contact hole 834 is so located as to be adjacent to the cut side. The number of types of rotation angles (rotation positions) at which the colored areas 860 of the same color are disposed is the quotient of the number of plurality of colors divided by a natural number greater than or equal to 2.

A set of colored areas 860, which form each full-color pixel 862, are so arranged as to have the same rotation angle (rotation position). For example, in a first full-color pixel 862A, all the colored areas 860 are arranged at a rotation angle (rotation position) that causes the cut side to form the upper right side. In a second full-color pixel 862B, which is adjacent to the first full-color pixel 862A in the first direction D1, all the colored areas 860 are arranged at a rotation angle (rotation position) that causes the cut side to form the lower right side.

In the first full-color pixel 862A and a fourth full-color pixel 862D, which are adjacent to each other in the second direction D2 perpendicular to the first direction D1, all the colored areas 860 are so arranged as to have the same rotation angle (rotation position). Similarly, in the second full-color pixel 862B and a third full-color pixel 862C, which are adjacent to each other in the second direction D2, all the colored areas 860 are so arranged as to have the same rotation angle (rotation position).

Ninth Embodiment

Figure 11:
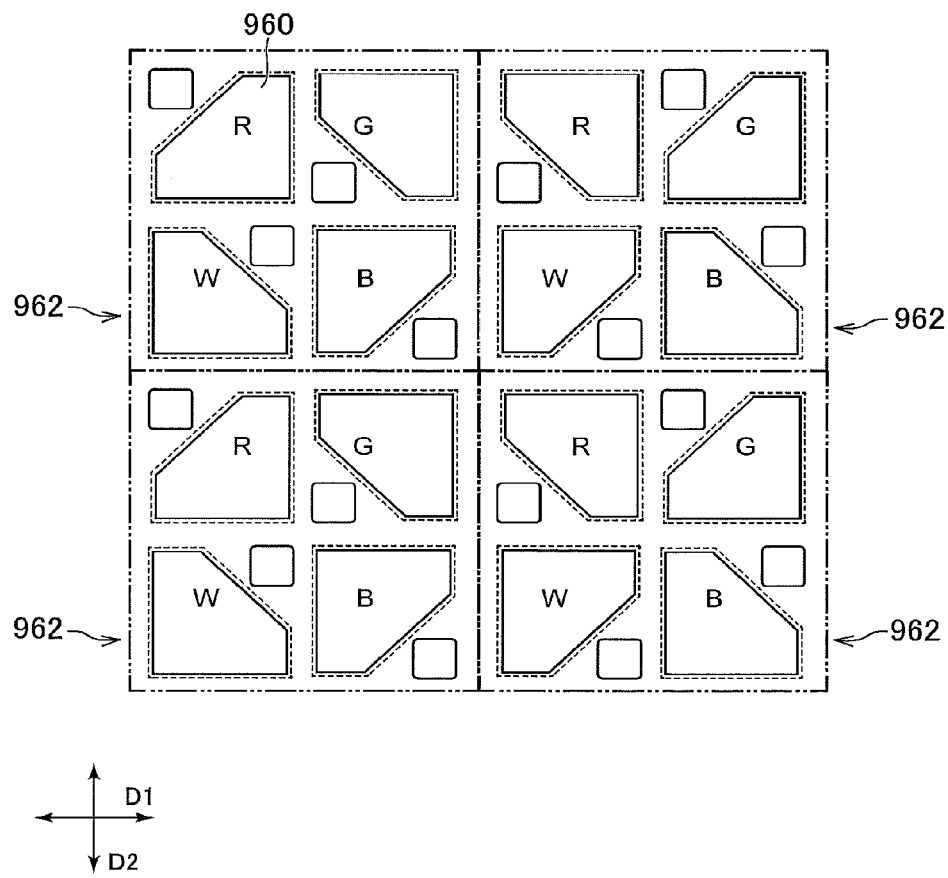
FIG. 11 is an enlarged view showing part of a plane of a display device according to a ninth embodiment.

FIG. 11 is an enlarged view showing part of a plane of a display device according to a ninth embodiment. The present embodiment differs from the eighth embodiment in that a set of colored areas 960, which form each of a plurality of full-color pixels 962, are so arranged as to have rotation angles (rotation positions) all different from one another.

Tenth Embodiment

Figure 12:
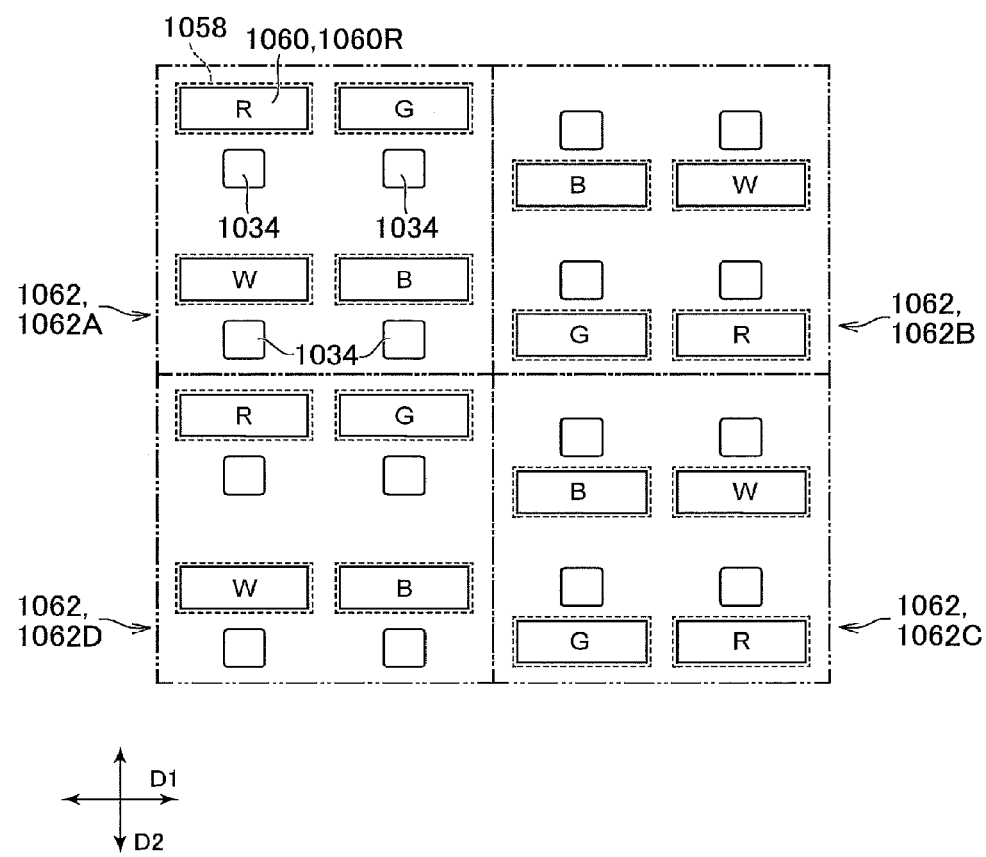
FIG. 12 is an enlarged view showing part of a plane of a display device according to a tenth embodiment.

FIG. 12 is an enlarged view showing part of a plane of a display device according to a tenth embodiment. In the present embodiment, each light emitting area 1058 has a shape having a wide width along one of two axes perpendicular to each other and a narrow width along the other one of the two axes (oblong shape, for example). A contact hole 1034 is adjacent to each of the light emitting areas 1058 in the direction along the narrow width. The plurality of light emitting areas 1058 are so arranged that the direction from the light emitting areas 1058 to the contact holes 1034 has a plurality of different types (two types in this example).

Each colored area 1060 has a shape having a wide width along one of the two axes perpendicular to each other and a narrow width along the other one of the two axes (oblong shape, for example). The contact holes 1034 are adjacent to the colored areas 1060 in the direction along the narrow width. The colored areas 1060 are so arranged that the direction from the colored areas 1060 to the contact holes 1034 has a plurality of different types (two types in this example).

The plurality of colored areas 1060 are grouped on the basis of a set of colored areas 1060 having colors different from one another to form a plurality of full-color pixels 1062. The set of colored areas 1060, which form each of the plurality of full-color pixels 1062, are so arranged as to have the same direction from the colored areas 1060 toward the contact holes 1034.

The plurality of full-color pixels 1062 are so arranged that the direction from the colored areas 1060 of the same color has a plurality of different types. For example, in a first full-color pixel 1062A, the direction from a red colored area 1060R to the contact hole 1034 is the downward direction in FIG. 12. In a second full-color pixel 1062B adjacent to the first full-color pixel 1062A in the first direction D1, the direction from the red colored area 1060R to the contact hole 1034 is the upward direction in FIG. 12. The number of types of one direction from colored areas 1060 of the same color is the quotient of the number of plurality of colors (4 in this example) divided by a natural number greater than or equal to 2 (2 in this example).

The first full-color pixel 1062A and a fourth full-color pixel 1062D (or second full-color pixel 1062B and third full-color pixel 1062C) are full-color pixels 1062 of the same type and have the same direction from the red colored areas 1060R to the contact holes 1034. That is, full-color pixels 1062 of the same type have the same direction from the colored areas 1060 of the same color to the contact holes 1034.

The first full-color pixel 1062A and the second full-color pixel 1062B (or third full-color pixel 1062C and fourth full-color pixel 1062D) are full-color pixels 1062 of the different types and have different directions from the red colored areas 1060R to the contact holes 1034. That is, full-color pixels 1062 of the different types have different directions from the colored areas 1060 of the same color to the contact holes 1034. The other contents correspond to those described in the first embodiment.

According to the present embodiment, the plurality of light emitting areas 1058 and the plurality of colored areas 1060 are so arranged that the direction from a colored area 1060 toward the corresponding contact hole 1034 has a plurality of different types. Therefore, the effect on the light incident on the contact holes 1034 and reflected off the contact holes 1034 varies depending on the viewing direction. As a result, the luminance and tint of the light vary depending on the viewing direction. However, since in the full-color pixels 1062 of the different types, the direction from colored areas 1060 of the same color toward the contact holes 1034 differs between the different types, the differences in luminance and tint are dispersed and homogenized as a whole.

Eleventh Embodiment

Figure 13:
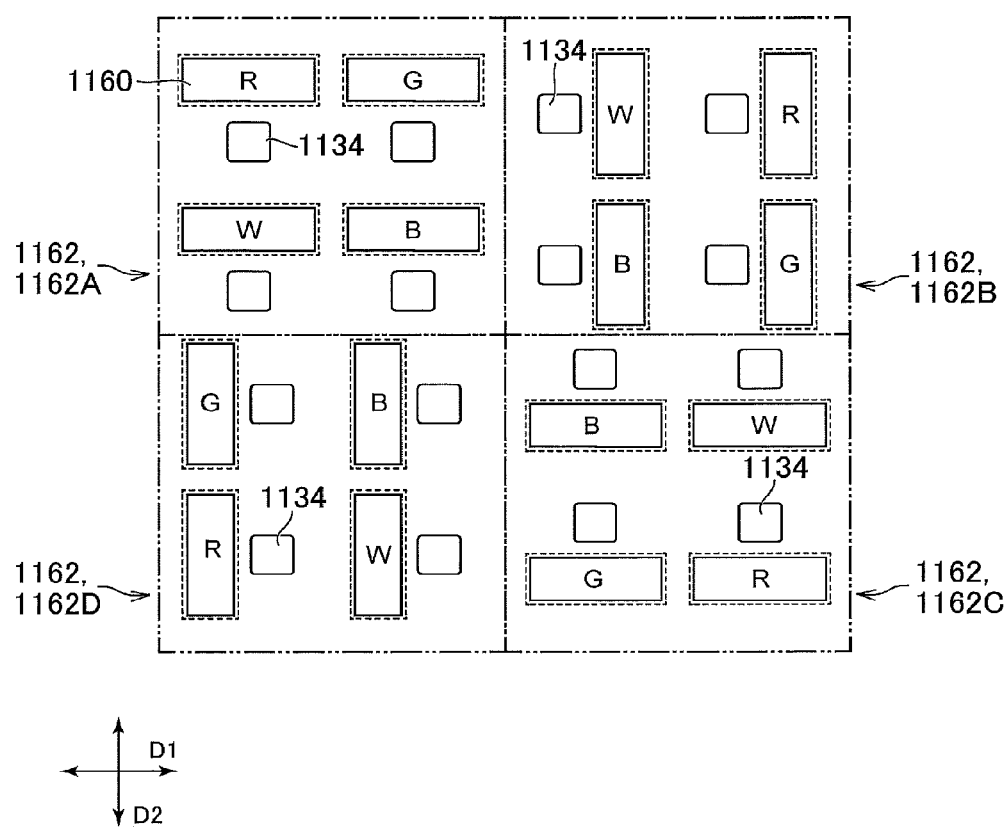
FIG. 13 is an enlarged view showing part of a plane of a display device according to an eleventh embodiment.

FIG. 13 is an enlarged view showing part of a plane of a display device according to an eleventh embodiment. In the present embodiment, a set of colored areas 1160, which form each full-color pixel 1162, are so arranged as to have the same direction from the colored areas 1160 toward contact holes 1134.

For example, in a first full-color pixel 1162A, the direction from all the colored areas 1160 toward the contact holes 1134 is the downward direction in FIG. 13. In a second full-color pixel 1162B, the direction from all the colored areas 1160 toward the contact holes 1134 is the leftward direction in FIG. 13. In a third full-color pixel 1162C, the direction from all the colored areas 1160 toward the contact holes 1134 is the upward direction in FIG. 13. In a fourth full-color pixel 1162D, the direction from all the colored areas 1160 toward the contact holes 1134 is the rightward direction in FIG. 13. The present embodiment therefore differs from the tenth embodiment in that the number of types of the direction from the colored areas 1160 of the same color toward the contact holes 1134 is equal to the number of plurality of colors (4 in this example).

The display device is not limited to an organic electroluminescence display device and may be a display device including a quantum-dot light emitting diode (QLED) or any other light emitting element in each pixel.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   a circuit layer including a plurality of thin film transistors;
   a plurality of pixel electrodes provided in correspondence with a plurality of unit pixels that form an image;
   a planarizing layer over the plurality of thin film transistors and under the plurality of pixel electrodes, the planarizing layer having a plurality of holes under the plurality of pixel electrodes for connecting the plurality of pixel electrodes and the plurality of thin film transistors;
   an insulating layer having a plurality of openings containing the plurality of pixel electrodes and so provided as to be placed on peripheral edge portions of the plurality of pixel electrodes;
   a light emitting element layer so layered on the insulating layer as to be in contact with the plurality of pixel electrodes in such a way that the plurality of openings form a plurality of light emitting areas;
   a common electrode so layered as to be in contact with the light emitting element layer above the plurality of pixel electrodes; and
   a color filter layer having a black matrix that forms light blocking areas and having a plurality of colored layers that form a plurality of colored areas corresponding to the plurality of light emitting areas, wherein
   the plurality of light emitting areas and the plurality of colored areas each have a predetermined planar shape having no rotational symmetry so that rotation of the area by an angle greater than or equal to 0° but smaller than 360° does not produce an initial shape of the area and are so arranged as to have a plurality of different types of rotation angle,
   the plurality of colored areas are grouped based on a set of the colored areas of colors different from one another to form a plurality of full-color pixels arranged in a first direction and a second direction crossing the first direction,
   the plurality of full-color pixels are so arranged that the rotation angle of the colored areas of the same color has a plurality of different types,
   in the full-color pixels of the same type, the colored areas of the same color have the same rotation angle,
   in the full-color pixels of different types, the colored areas of the same color have different rotation angles,
   each of some of the full-color pixels, which includes a first colored area, corresponds to a first hole and a second hole of the plurality of holes,
   each of others of the full-color pixels includes a second colored area that is different from the first colored area in color,
   the first hole is next to the second hole on one side in the first direction,
   the first hole is next to the first colored area on another side in the first direction, the first hole is next to the first colored area on one side in the second direction, and the first hole is next to the second colored area on another side in the second direction.

2. The display device according to claim 1, wherein the number of types of rotation angles at which the colored areas of the same color are disposed is equal to the number of plurality of colors.

3. The display device according to claim 1, wherein the number of types of rotation angles at which the colored areas of the same color are disposed is a quotient of the number of plurality of colors divided by a natural number greater than or equal to 2.

4. The display device according to claim 1, wherein in any of the sets of the colored areas, which form the full-color pixels, the colored area of the same color is located in the same position with respect to the colored areas of the other colors.

5. The display device according to claim 1, wherein the set of the colored areas, which form each of the plurality of full-color pixels, are so arranged as to have a plurality of different types of rotation angle.

6. The display device according to claim 5, wherein the set of the colored areas, which form each of the plurality of full-color pixels, are so arranged as to have rotation angles all different from one another.

7. The display device according to claim 1, wherein each of the colored areas is divided by the corresponding light blocking area of the black matrix into a plurality of portions.

8. The display device according to claim 1, wherein the planar shape of each of the plurality of light emitting areas and the plurality of colored areas has an L-letter shape.

* * * * *